United States Patent
Amon et al.

(10) Patent No.: US 6,368,940 B1
(45) Date of Patent: Apr. 9, 2002

(54) METHOD FOR FABRICATING A MICROELECTRONIC STRUCTURE

(75) Inventors: Jürgen Amon, Dresden; Albrecht Kieslich, Radebeul, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/642,325

(22) Filed: Aug. 21, 2000

(30) Foreign Application Priority Data

Aug. 20, 1999 (DE) .......................... 199 39 597

(51) Int. Cl.⁷ .............................................. H01L 21/76
(52) U.S. Cl. .................. 438/424; 438/407; 438/431; 438/433; 438/435
(58) Field of Search ................................ 438/407, 418, 438/423, 424, 425, 426, 431, 433, 435, 440, 447, 449

(56) References Cited

U.S. PATENT DOCUMENTS

| 5,811,347 A | * | 9/1998 | Gardner et al. | 438/435 |
| 5,851,899 A | * | 12/1998 | Weigand | 438/427 |
| 5,882,964 A | * | 3/1999 | Schwalke | 438/227 |
| 5,882,993 A | * | 3/1999 | Gardner et al. | 438/591 |
| 5,891,787 A | * | 4/1999 | Gardner et al. | 438/424 |
| 6,284,626 B1 | * | 9/2001 | Kim | 438/433 |

FOREIGN PATENT DOCUMENTS

WO   WO 99/25018   * 5/1999

* cited by examiner

*Primary Examiner*—Charles Bowers
*Assistant Examiner*—Jack Chen
(74) *Attorney, Agent, or Firm*—Herbert L. Lerner; Laurence A. Greenberg; Werner H. Stemer

(57) ABSTRACT

A method for fabricating a microelectronic structure includes implanting nitrogen into a semiconductor substrate which is provided with trenches, at least in the region of a main area of the semiconductor substrate. The implantation is intended to be carried out in such a way that a nitrogen concentration at the main area is considerably greater than at the side walls of the trenches. As a result, during subsequent oxidation of the semiconductor substrate, a thinner oxide layer can be formed on the main area, in comparison with the side walls. The oxide layer has a homogeneous transition in the edge region between the main area and the side walls. Implanting nitrogen prior to the oxidation of the semiconductor substrate leads to a uniform oxide layer thickness on the main area.

11 Claims, 4 Drawing Sheets

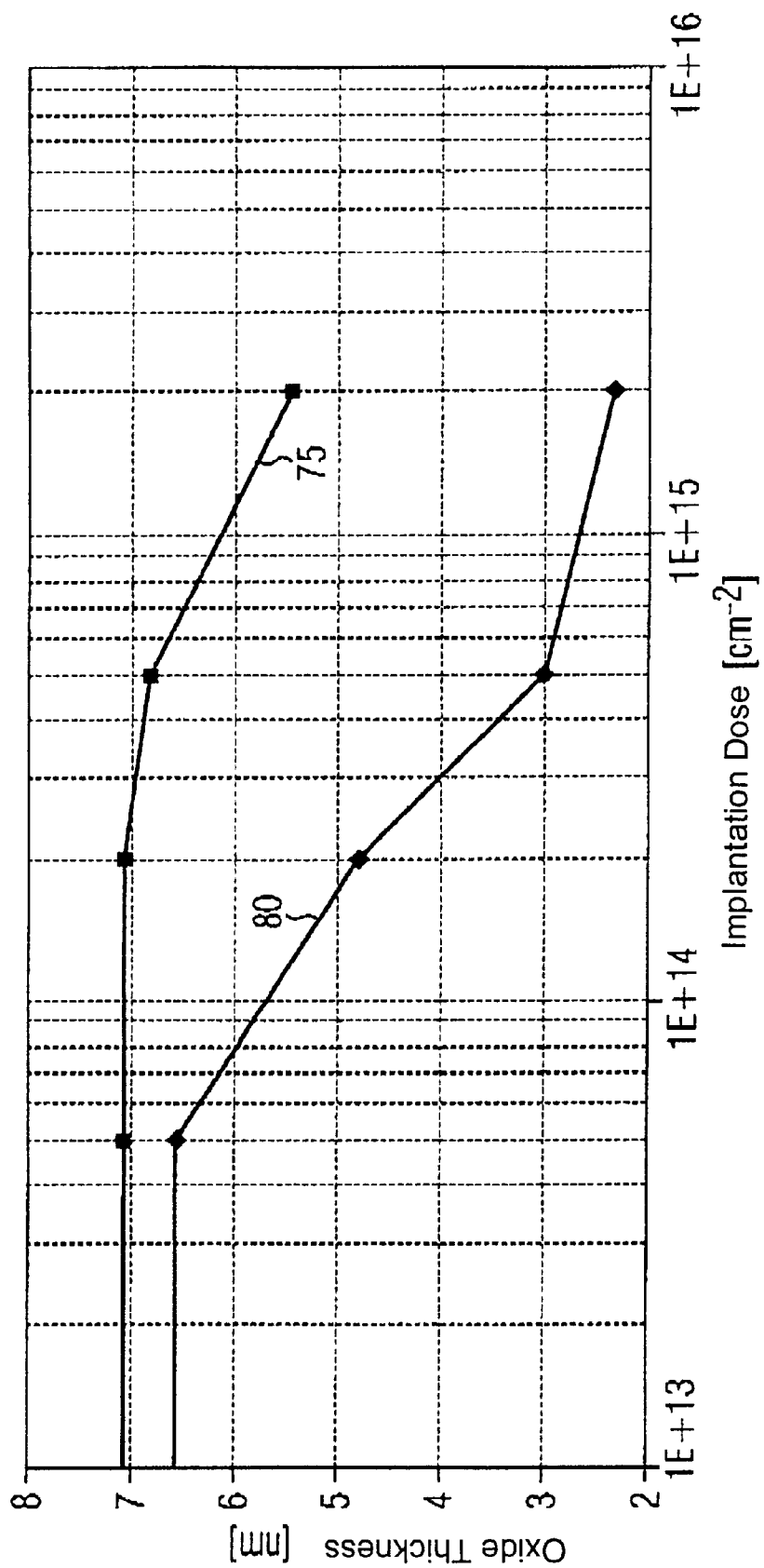

METHOD FOR FABRICATING A MICROELECTRONIC STRUCTURE

BACKGROUND OF THE INVENTION

Field of the Invention

The invention is in the field of semiconductor technology and relates to a method for fabricating a microelectronic structure having the following steps: providing a semiconductor substrate having a main area and at least one trench disposed at the main area, the trench having at least one side wall and the side wall and the main area having at least one common edge region; filling the trench with an insulating material leaving the edge region uncovered; and oxidizing the main area and the edge region to form an oxide layer having a thickness in the edge region at least just as great as at the main area.

During the fabrication of integrated circuits, active components disposed in the semiconductor substrate have to be suitably insulated from one another. One possibility for doing that resides in insulating the active components from one another through the use of trench isolation (so-called Shallow Trench Isolation (STI)). In that type of insulation, trenches are etched into the semiconductor substrate and subsequently filled with an insulating material.

Instances of such trench isolation can be found, for example, in German Published, Non-Prosecuted Patent Application DE 197 31 203 A1 and German Patent DE 195 35 629 C1. In the methods described therein, an oxide layer serving as gate oxide and a polysilicon layer serving as gate electrode are applied to the semiconductor substrate. Afterwards, trenches are etched into that layer system down into the semiconductor substrate. The trenches define the position of the individual active components. Finally, the trenches are filled with a thermal oxide. In those methods, however, it has turned out to be problematic that in the course of filling the trenches, the semiconductor substrate and the polysilicon may be partially oxidized, thereby producing a gate dielectric having a varying thickness. In order to minimize that problem, German Patent DE 197 31 203 C1 proposes implanting nitrogen into the gate dielectric after the formation of the gate oxide and before the filling of the trenches, in order to thereby limit the lateral oxygen diffusion. It has been shown, however, that such a measure also cannot completely eliminate the problem.

U.S. Pat. No. 5,882,993 discloses the use of nitrogen for forming gate dielectrics of varying thicknesses. To that end, nitrogen is implanted in a laterally varying concentration into a silicon substrate provided with trenches that have already been filled, and an oxide is subsequently formed thereon. However, due to the varying nitrogen concentration in the silicon substrate, oxides of varying thicknesses are formed which may often have an inhomogeneous thickness in the transition regions to the trenches that have already been filled.

It is problematic, moreover, that gate oxides are often severely thinned at the transition regions from the silicon substrate to the isolation trenches (e.g. so-called Shallow Trench Isolation). So-called corner devices form at the transition regions. The corner devices usually have a lower threshold voltage than the actual transistor and, as a result, adversely affect the switching characteristic and the leakage current behavior of the entire transistor. That behavior is additionally aggravated by a thin gate oxide at the transition regions. The effect of the corner device has usually been reduced through the use of a higher channel doping, but that in turn entails undesirable side effects.

In order to avoid the corner device, International Publication No. WO 99/25018 attempts to damage the edge region between the main area and the trench by amorphizing implantation. The aim is to produce a somewhat thicker oxide layer there in the course of the subsequent oxidation.

The method mentioned in the introduction, on the other hand, is disclosed e.g. in U.S. Pat. No. 5,891,787, where, after the formation and filling of a trench, silicon is implanted into the edge regions between the trench and the main area. That implantation is intended to bring about an excess of silicon atoms in the edge region with the main area covered, so that a thicker oxide layer than in the region of the main area can be produced there in the course of the subsequent oxidation. The implantation of nitrogen for the formation of diffusion barrier centers and elimination of crystal defects is described as an alternative. Although local thickening of the oxide layer serving as gate dielectric can be achieved by that method, microelectronic structures that are fabricated in that way only exhibit unsatisfactory properties. That is due, for example, to the fact that the oxide layer produced due to the silicon excess has a different material structure than that formed on the main area and exhibits an increased leakage current tendency. The formation of the corner device is thereby likewise only suppressed to an insufficient extent.

SUMMARY OF THE INVENTION

It is accordingly an object of the invention to provide a method for fabricating a microelectronic structure, which overcomes the hereinafore-mentioned disadvantages of the heretofore-known methods of this general type and which enables largely homogeneous gate dielectrics to be formed, with the formation of a corner device being suppressed.

With the foregoing and other objects in view there is provided, in accordance with the invention, a method for fabricating a microelectronic structure, which comprises the following steps providing a semiconductor substrate having a main area and at least one trench disposed at the main area, the at least one trench having at least one side wall, and the at least one side wall and the main area having at least one common edge region; filling the trench with an insulating material leaving the edge region uncovered; introducing nitrogen into the semiconductor substrate to provide a higher nitrogen concentration in the vicinity of the main area than in the edge region; and then oxidizing the main area and the edge region to form an oxide layer with a thickness in the edge region at least just as great as on the main area, the nitrogen causing the oxide layer to grow more slowly in the main area than in the edge region.

According to the present invention, a semiconductor substrate is provided and at least one trench having a side wall is introduced at the main area of the semiconductor substrate. This trench defines, for example, the position of an active component in the semiconductor substrate. In the transition region between the side wall of the trench and the main area of the semiconductor substrate there is an edge region formed by both of them.

Nitrogen is subsequently introduced into the semiconductor substrate, with a higher nitrogen concentration being sought in the region of the main area than in the edge region. In this case, the difference in nitrogen concentration should be dimensioned in such a way that oxide layers each having a predetermined thickness are produced in the course of subsequent oxidation of the semiconductor substrate, i.e. of the main area and of the edge region. In the common edge region between the main area and the side wall, the nitrogen concentration preferably uniformly decreases in the direction of the side wall. The effect that is intended to be achieved as a result of this is that the oxide layer which is subsequently to be formed has an increasing thickness in the edge region and thereby contributes to a uniform transition from the oxide layer thickness on the main area to the oxide layer thickness on the side wall. In this case, however, what is sought is an oxide layer thickness that is as uniform as possible as far as the edge region and even into the edge region.

The particular effect achieved through the use of the method according to the invention is that the oxide layer is not thinned in a disturbing manner in the edge region between the main area and the side wall, and the undesirable influence on the transistor properties by the so-called corner device is thereby avoided. The effect of the corner device is disturbing particularly in the case of a cell transistor required for DRAM cells since, due to increased leakage currents, the stored charge flows away undesirably faster and the memory cell thus has to be refreshed again in shorter time intervals.

A further advantage of the use of the method according to the invention resides in the fact that the lower threshold voltage of the corner device in comparison with the cell transistor (the threshold voltage is lower even given an identical oxide thickness of the corner device and of the cell transistor), can be compensated for by a thicker gate oxide in the edge region.

It has been shown that by targeted retardation of the oxidation of the main area by the nitrogen introduced beforehand, a relatively uniform oxide layer having a sufficient thickness in the edge region can be formed.

Nitrogen is preferably introduced by implantation into the semiconductor substrate, in which case it has proved favorable for nitrogen to be implanted essentially only at the main area and partially in the edge region. This can be achieved, for example, by nitrogen being introduced into the semiconductor substrate by implantation which is to the greatest possible extent perpendicular to the main area. However, the implantation angle relative to the main area may also encompass a certain solid angle range in order to ensure sufficient implantation of nitrogen in the edge region as well.

The implantation of nitrogen should preferably be performed very near the surface, and this can be achieved, for example, by an implantation energy of 10–30 keV. By virtue of the largely perpendicular implantation near the surface, it is possible to establish e.g. a ratio of the nitrogen concentration at the main area to that at the edge region of, preferably, greater than 2 to 1, which manifests itself in a distinctly varying oxide thickness.

A further advantage of the method according to the invention resides in the fact that, due to the compensated threshold voltage of the corner device, it is possible to dispense with a higher doping of the semiconductor substrate. The relatively high doping of the semiconductor substrate is generally used to counteract the decreased threshold voltage of the corner device. However, this high doping, which may be present, for example, in the form of a well doping, unfavorably induces a further leakage mechanism. The latter is referred to as so-called "junction leakage" and manifests itself in a defect-driven and field-driven leakage current in the space charge zone of the PN junction between a source or drain region and the semiconductor substrate. This type of leakage current is predominant particularly in MOSFET transistors having a small channel width.

The relatively high doping of the well, i.e. of the channel region, that is usually necessary can therefore be dispensed with when the method according to the invention is used. As a result, reliable transistors can thus be fabricated which are distinguished, in particular, by a lower leakage current rate and a more accurately defined threshold voltage.

Other features which are considered as characteristic for the invention are set forth in the appended claims.

Although the invention is illustrated and described herein as embodied in a method for fabricating a microelectronic structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a graph of oxide thickness as a function of chosen implantation dose.

DESCRIPTION OF THE PREFERRED EMBODIMENTS

Figure 1A:
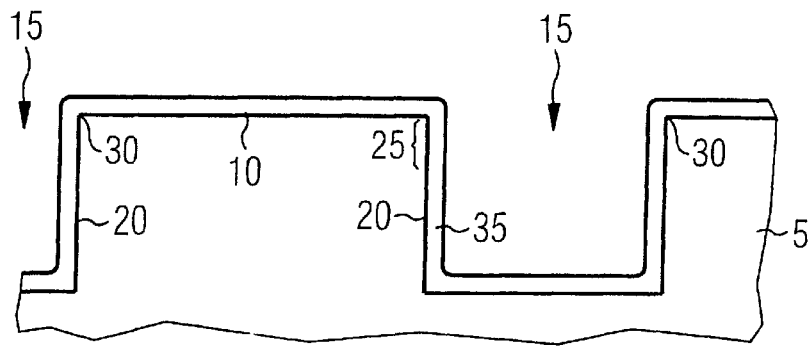
FIGS. 1A to 1F are fragmentary, diagrammatic, cross-sectional views illustrating different method steps in a fabrication method according to the invention.

Referring now to the figures of the drawings in detail and first, particularly, to FIGS. 1A to 1F thereof, there is seen a structure from which a description of a method according to the invention proceeds. A semiconductor substrate 5, which is preferably composed of monocrystalline silicon, has a main area 10. Trenches 15 are introduced into the semiconductor substrate 5 at the main area 10. The trenches 15 have side walls 20 with an upper region 25 forming edge regions 30 adjoining the main area 10. Although the upper region 25 of the side walls 20 is shown to be almost vertical herein, it may also be partially rounded, so that the edge region 30 corresponds to a rounded region formed by the main area 10 and the side walls 20.

Figure 1B:
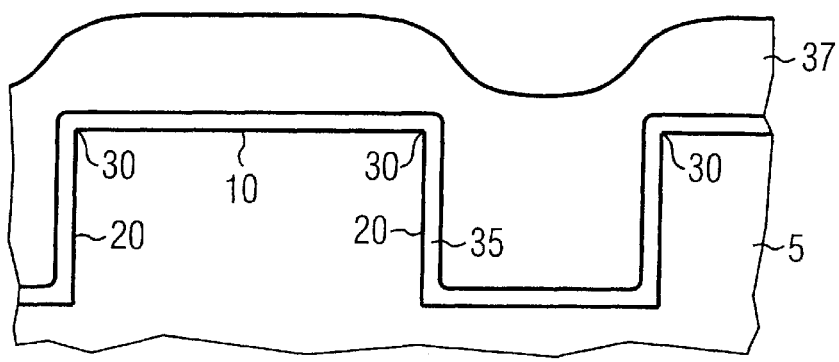

A thin intermediate oxide layer 35 is subsequently applied to the semiconductor substrate 5. That intermediate oxide layer serves for protecting the semiconductor substrate 5 as the trenches 15 are subsequently filled with an insulating material. The trenches 15 form a so-called Shallow Trench Isolation (STI). The trenches are preferably filled with a silicon oxide layer 37 and the silicon oxide is subsequently planarized. A method which is suitable in this respect is described, for example, in U.S. Pat. No. 5,851,899, the content of the disclosure of which is incorporated herein in its entirety. The filling of the trenches is illustrated in FIG. 1B.

Figure 1C:
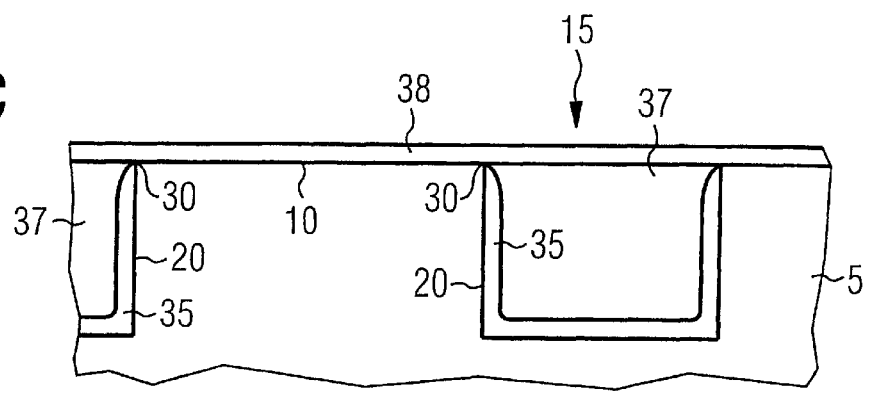
Figure 1D:
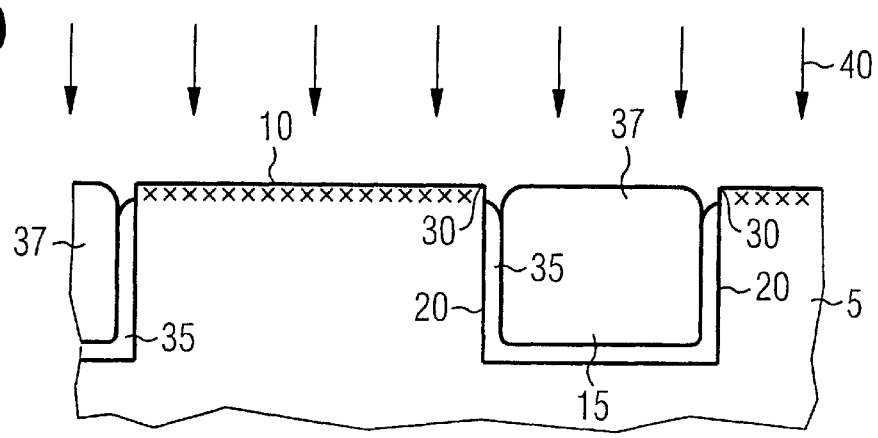
Figure 1E:
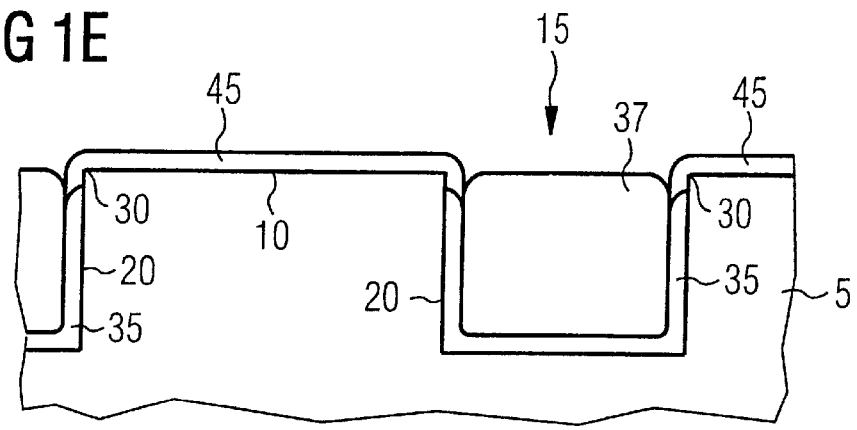

After the planarization of the silicon oxide 37 with simultaneous removal of the intermediate oxide layer 35 from the main area 10, a screen oxide layer 38 is formed on the main area 10 and the filled trenches 15. The screen oxide 38, which is shown in FIG. 1C, is used in the course of a subsequent implantation of dopants for forming well regions of transistors. However, this method step is not illustrated in the figures. Nitrogen is subsequently implanted into the semiconductor substrate 5 that is provided with the trenches 15, through the use of implantation which is preferably perpendicular to the main area 10. The screen oxide 38 is then removed again. The edge regions 30 of the semiconductor substrate 5 are uncovered in the course of this etching-back process. The structure thus obtained is shown in FIG. 1D.

Due to the largely perpendicular implantation, the nitrogen is concentrated essentially only at the areas which are perpendicular to the implantation, so that nitrogen is implanted to the greatest possible extent in the region of the main area 10. Depending on the implantation angle, nitrogen is also implanted into the side walls 20 and, in particular, into the edge region 30. However, the implantation should preferably be effected in such a way that significantly more nitrogen is implanted into the main area 10 than in the edge region 30.

On one hand, the implantation of nitrogen is shown by arrows 40. On the other hand, the varying distribution of nitrogen in the semiconductor substrate is shown diagrammatically in FIG. 1D.

After implantation, the semiconductor substrate 5 is oxidized on its surface in order to form an oxide layer 45 (gate oxides). In this case, the main area 10 and the edge region 30 are in particular intended to be coated with the oxide layer 45. The semiconductor substrate 5 is oxidized, for example, at temperatures of between 700 and 1100° C. The duration of this temperature step depends on the nitrogen concentration level and the desired oxide thickness. The temperature is preferably chosen in a manner dependent on the desired thickness of the oxide layer 45, noting that a lower temperature is preferred for thinner oxides. The oxide layer 45 grows at a lower rate at a lower temperature, so that the target thickness of the oxide layer 45 can readily be established by way of the duration. Moreover, at a lower temperature, there is less of a burden on the semiconductor substrate 5 with already integrated doping regions.

The oxide layer 45 formed by the oxidation has an increasing layer thickness in the edge region 30 proceeding from the main area 10, so that at least the same thickness as in the region of the main area 10 is achieved in the edge region 30. Oxidation of the semiconductor substrate 5 after nitrogen implantation creates particularly uniform transitions of the oxide layer 45 in the edge region 30, thereby avoiding the formation of disturbing corner devices having a reduced threshold voltage. Moreover, highly homogeneous, dense oxide layers 45 are formed which are substantially uniform and have a homogeneous material structure.

Figure 1F:
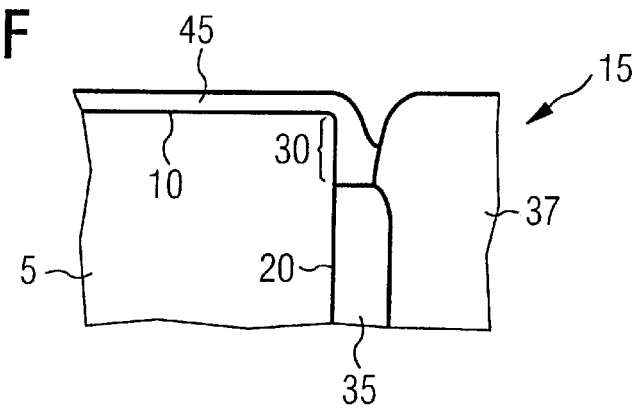

The transition of the oxide layer 45 in the edge region 30 is shown enlarged in FIG. 1F.

Figure 3:
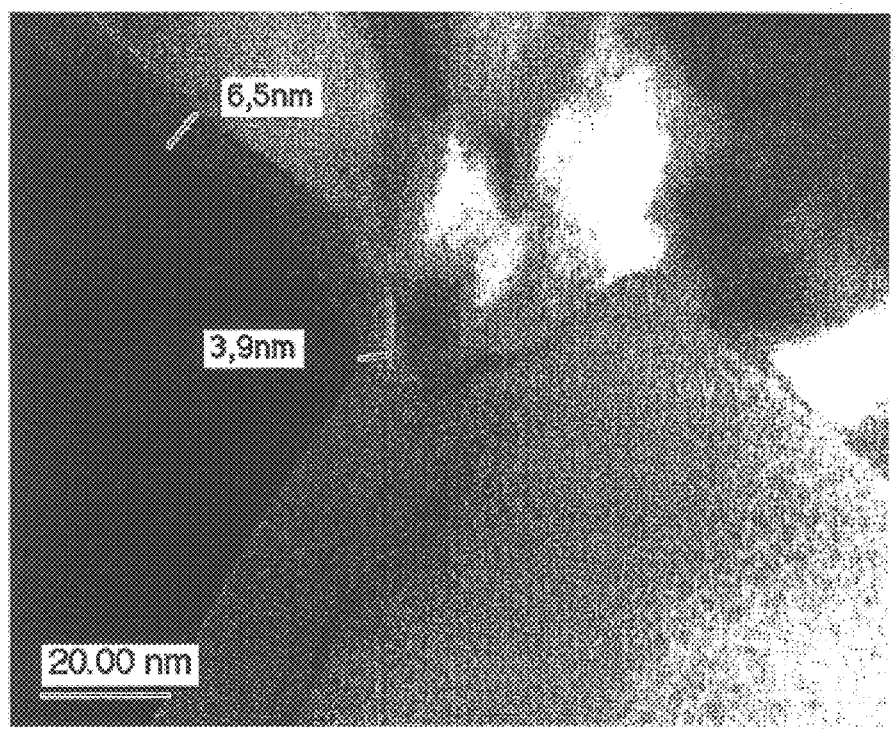
FIG. 3 is an SEM photograph of an oxide layer without prior nitrogen implantation.
Figure 4:
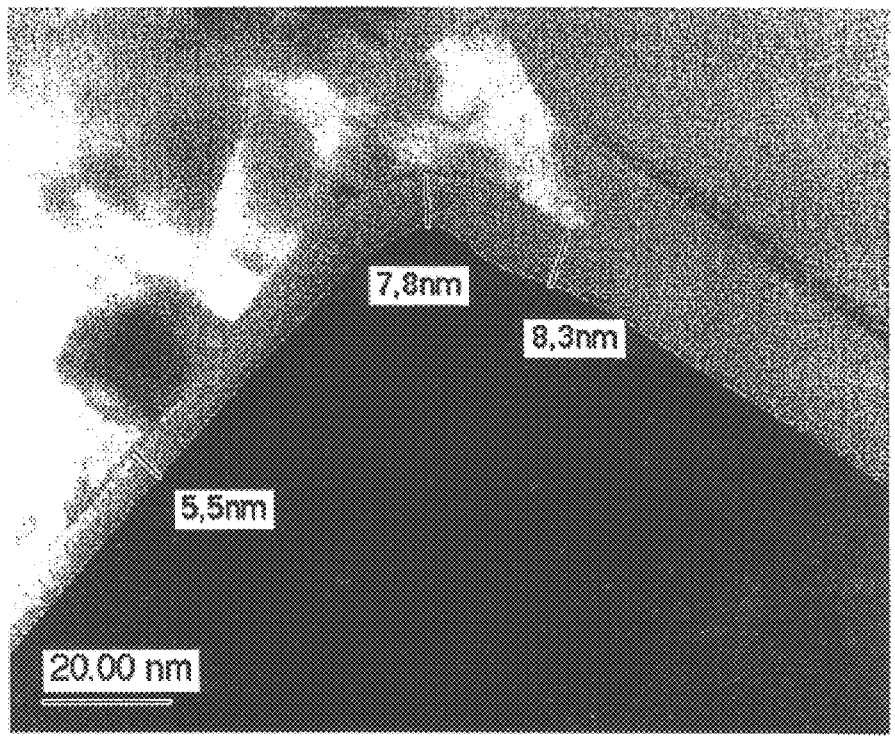
FIG. 4 is an SEM photograph of an oxide layer fabricated by the method according to the invention.

Reference is made to FIGS. 3 and 4 to provide further illustration of the method according to the invention. FIG. 3 shows an SEM photograph of an oxide layer fabricated without prior implantation of nitrogen. Severe thinning of the oxide layer in the edge region is clearly discernible and leads to the formation of the disturbing corner devices mentioned above. In contrast thereto, FIG. 4 shows an oxide layer fabricated by the method according to the invention. The oxide layer has a thickness of about 5.5 nm on the main area of the silicon substrate, which appears dark in the SEM photograph, and of about 8.3 nm in the region of the side wall. The oxide layer thickness is about 7.8 nm in the edge region. The uniform increase in the oxide layer thickness in the edge region is clearly discernible. That increase precludes the formation of corner devices having a reduced threshold voltage.

After the formation of the oxide layer 45, a gate electrode may, for example, be deposited on the oxide layer 45. Suitable method steps for this purpose are described, for example, in German Patent DE 195 35 629 C1, which has already been cited and the content of the disclosure of which is hereby incorporated in its entirety.

Figure 2:
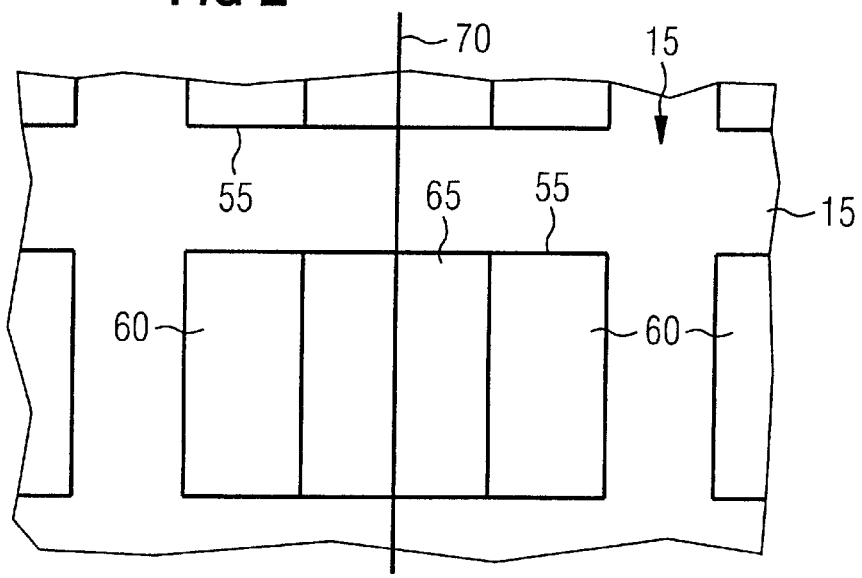
FIG. 2 is a plan view of a semiconductor substrate.

The position of the section shown in FIGS. 1A to 1F and the position of source and drain regions are shown by way of example using a plan view of the semiconductor substrate 5 in FIG. 2. The trench 15, which runs through the semiconductor substrate 5 in the form of mutually perpendicular troughs, isolates active regions 55 from one another. In this case, each active region 55 has two mutually isolated doping regions 60, which respectively constitute a source region and a drain region. Seated between these on the surface of the semiconductor substrate 5 is a gate electrode 65, under which the non-illustrated oxide layer 45 is situated. A section line for the illustration of FIGS. 1A to 1E is designated by reference numeral 70.

The dependence of the oxide thickness on the implantation dose is illustrated in FIG. 5. A curve 75 shows the oxide thickness achieved in the case of a temperature treatment at about 1015° C. carried out before the fabrication of the gate oxide, whereas a curve 80 shows the oxide thickness without such a temperature treatment. So-called rapid thermal annealing was chosen as the temperature treatment in the present case. Energies of between 10 and 30 keV are preferably used for the implantation. The oxide thickness which is preferably sought on the main area of the semiconductor substrate is between 2 and 10 nm, preferably between 3 and 6 nm.

We claim:

1. A method for fabricating a microelectronic structure, which comprises the following steps:

providing a semiconductor substrate having a main area and at least one trench disposed at the main area, the at least one trench having at least one side wall, and the at least one side wall and the main area having at least one common edge region;

filling the trench with an insulating material leaving the edge region uncovered;

introducing nitrogen into the semiconductor substrate to provide a higher nitrogen concentration in the vicinity of the main area than in the edge region; and then oxidizing the main area and the edge region to form an oxide layer with a thickness in the edge region at least as great as on the main area, the nitrogen causing the oxide layer to grow more slowly in the main area than in the edge region.

2. The method according to claim 1, which further comprises providing the thickness of the oxide layer to be greater in the edge region than at the main area.

3. The method according to claim 1, which further comprises carrying out the step of introducing the nitrogen by implantation into the semiconductor substrate.

4. The method according to claim 3, which further comprises carrying out the step of implanting the nitrogen substantially only at the main area and in the edge region.

5. The method according to claim 3, which further comprises carrying out the step of introducing the nitrogen into the semiconductor substrate by implantation perpendicular to the main area to the greatest possible extent.

6. The method according to claim 4, which further comprises carrying out the step of introducing the nitrogen into the semiconductor substrate by implantation perpendicular to the main area to the greatest possible extent.

7. The method according to claim 3, which further comprises carrying out the step of introducing the nitrogen into the main area by implantation with a dose of from $10^{13}$ to $10^{16}$ cm$^{-2}$.

8. The method according to claim 4, which further comprises carry out the step of introducing the nitrogen into the main area by implantation with a dose of from $10^{13}$ to $10^{16}$ cm$^{-2}$.

9. The method according to claim 5, which further comprises carry out the step of introducing the nitrogen into the main area by implantation with a dose of from $10^{13}$ to $10^{16}$ cm$^{-2}$.

10. The method according to claim 6, which further comprises carry out the step of introducing the nitrogen into the main area by implantation with a dose of from $10^{13}$ to $10^{16}$ cm$^{-2}$.

11. The method according to claim 1, which further comprises providing the oxide layer with a thickness of between 2 and 10 nm in the vicinity of the main area.

* * * * *